US010622055B2

(12) United States Patent
He et al.

(10) Patent No.: US 10,622,055 B2
(45) Date of Patent: Apr. 14, 2020

(54) APPARATUS FOR SUPPLYING POWER SUPPLY VOLTAGE TO SEMICONDUCTOR CHIP INCLUDING VOLATILE MEMORY CELL

(71) Applicant: Micron Technology, Inc., Boise, ID (US)

(72) Inventors: Yuan He, Hachioji (JP); Chikara Kondo, Hachioji (JP); Daigo Toyama, Fujisawa (JP)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/107,998

(22) Filed: Aug. 21, 2018

(65) Prior Publication Data

US 2020/0066324 A1 Feb. 27, 2020

(51) Int. Cl.

| | |
|---|---|
| ***G11C 5/14*** | (2006.01) |
| ***G11C 11/4074*** | (2006.01) |
| ***G11C 11/4096*** | (2006.01) |
| ***G11C 11/4093*** | (2006.01) |
| ***G11C 11/406*** | (2006.01) |

(52) U.S. Cl.

CPC .......... *G11C 11/4074* (2013.01); *G11C 5/147* (2013.01); *G11C 11/4093* (2013.01); *G11C 11/4096* (2013.01); *G11C 11/40615* (2013.01)

(58) Field of Classification Search

CPC ........... G11C 11/406; G11C 11/40618; G11C 11/40607

See application file for complete search history.

(56) References Cited

U.S. PATENT DOCUMENTS

| | | | | |
|---|---|---|---|---|
| 5,619,470 | A * | 4/1997 | Fukumoto | G11C 11/22 365/145 |
| 9,653,142 | B1 * | 5/2017 | Kihara | G11C 11/40615 |
| 2006/0098510 | A1 * | 5/2006 | Jo | G11C 11/406 365/222 |
| 2006/0256637 | A1 * | 11/2006 | Takahashi | G11C 11/406 365/222 |
| 2017/0110177 | A1 * | 4/2017 | Lee | G11C 11/40615 |
| 2017/0140810 | A1 * | 5/2017 | Choi | G11C 11/40603 |

* cited by examiner

*Primary Examiner* — Tuan T Nguyen

(74) *Attorney, Agent, or Firm* — Dorsey & Whitney LLP

(57) ABSTRACT

Disclosed herein is an apparatus that includes a first semiconductor chip including a memory cell array having a volatile memory cell and an access control circuit configured to perform a refresh operation on the volatile memory cell, and a second semiconductor chip including a power generator configured to supply a first power supply voltage to the first semiconductor chip. The access control circuit is configured to activate a first enable signal during the refresh operation. The second semiconductor chip is configured to change a capability of the power generator based on the first enable signal.

11 Claims, 4 Drawing Sheets

APPARATUS FOR SUPPLYING POWER SUPPLY VOLTAGE TO SEMICONDUCTOR CHIP INCLUDING VOLATILE MEMORY CELL

BACKGROUND

Memory devices such as a DRAM are operated with a power supply voltage supplied from a power management IC. The power management IC minimizes power consumption by changing the supply capability of the power supply voltage according to the current operation status of a DRAM. For example, during a period where a DRAM is performing a read operation or a write operation, the supply capability of the power supply voltage of the power management IC is set to be relatively large, and when the DRAM is in a standby mode, the supply capability of the power supply voltage of the power management IC is set to be relatively small.

However, because memory cells of a DRAM are volatile, even when the DRAM is in a standby mode, it is necessary to restore information held in the memory cells by periodically performing a refresh operation. Therefore, when the DRAM is in a standby mode, the power supply capability of the power management IC is set as the power supply capability required for the refresh operation.

DETAILED DESCRIPTION

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

Figure 1:
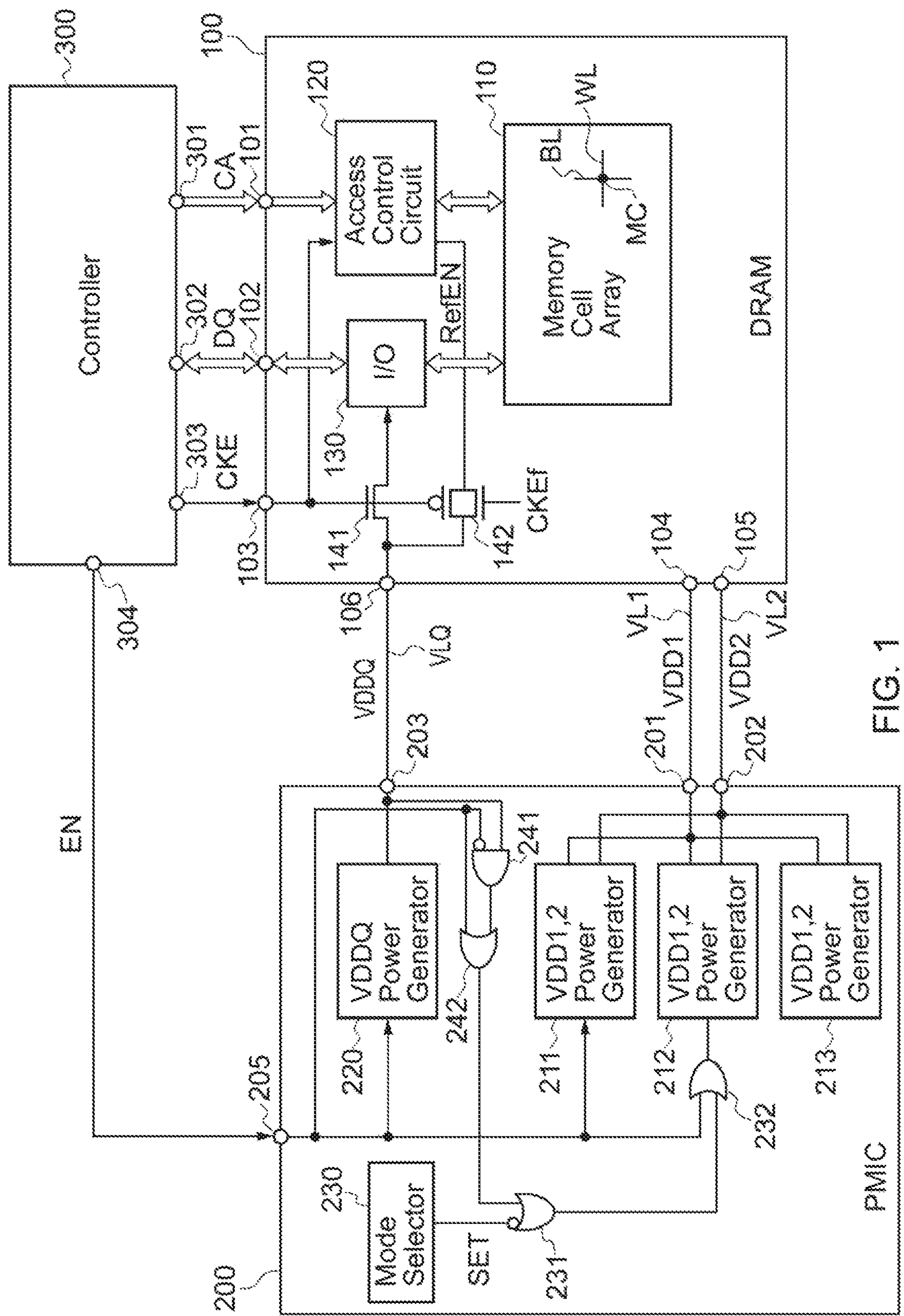
FIG. 1 is a block diagram showing a configuration of a memory system according to a first embodiment.

A memory system shown in FIG. 1 includes a DRAM 100, a power management IC 200 that supplies a power supply voltage to the DRAM 100, and a controller 300 that controls the DRAM 100 and the power management IC 200. The DRAM 100, the power management IC 200, and the controller 300 are integrated into respectively different semiconductor chips.

The DRAM 100 includes a memory cell array 110, an access control circuit 120 for accessing the memory cell array 110, and an I/O circuit 130 that inputs and outputs read data and write data. The memory cell army 110 includes a plurality of word lines WL, a plurality of bit lines BL, and a plurality of memory cells MC that are respectively arranged on an intersection of the word line WL and the bit line BL. The memory cells MC are volatile DRAM cells and require a periodical refresh operation to hold data therein. The refresh operation is performed by the access control circuit 120. The access control circuit 120 is operated based on a command address signal CA that is supplied from the controller 300 via a command address terminal 101. For example, when a read command and an address signal corresponding to the read command are included in the command address signal CA, the access control circuit 120 performs a read operation on the memory cell array 110. Due to this operation, read data DQ is read from a memory cell MC indicated by the address signal. The read data DQ is supplied to the controller 300 via the I/O circuit 130 and a data terminal 102. When a write command and an address signal corresponding to the write command are included in the command address signal CA, the access control circuit 120 performs a write operation on the memory cell array 110. Due to this operation, write data DQ supplied from the controller 300 via the data terminal 102 and the I/O circuit 130 is written in a memory cell MC indicated by the address signal.

The DRAM 100 includes a CKE terminal 103 to which a clock enable signal CKE is supplied. The clock enable signal CKE is input to the access control circuit 120. When the clock enable signal CKE is in an active state (for example, a high level), the DRAM 100 is operated in a normal operation mode, and when the clock enable signal CKE is in an inactive state (for example, a low level), the DRAM 100 is operated in a standby mode. When the DRAM 100 enters a standby mode, the DRAM 100 is in a low power consumption state where the DRAM 10K) holds data of the memory cell array 110 without performing a read operation or a write operation. However, because the memory cells MC are volatile, even in a standby mode, it is necessary to restore information held in the memory cells MC by periodically performing a refresh operation. The refresh operation in a standby mode is performed in a predetermined cycle by using an oscillator circuit included in the access control circuit 120. During a period where the refresh operation is actually performed in a standby mode, an enable signal RefEN is output from the access control circuit 120.

The DRAM 100 includes a power supply terminal 104 to which a power supply voltage VDD1 is supplied, a power supply terminal 105 to which a power supply voltage VDD2 is supplied, and a power supply terminal 106 to which a power supply voltage VDDQ is supplied. The power supply voltages VDD1 and VDD2 are supplied to the memory cell array 110 and the access control circuit 120, and are used as operating voltages of a word driver and a sense amplifier included in the memory cell array 110 and of various logic circuits included in the access control circuit 120. Meanwhile, the power supply voltage VDDQ is supplied to the I/O circuit 130 via a transistor 141. The I/O circuit 130 includes an output buffer that outputs the read data DQ read from the memory cell array 110 to the data terminal 102. The power supply voltage VDDQ is used as an operating voltage of an output buffer included in the memory cell array 10. The clock enable signal CKE is supplied to the gate electrode of the transistor 141. Due to this configuration, during a period where the clock enable signal CKE is at a high level, that is, in a normal operation mode, the power supply voltage VDDQ supplied to the power supply terminal 106 is properly given to the I/O circuit 130. Meanwhile, during a period where the clock enable signal CKE is at a low level, that is, in a standby mode, the transistor 141 is turned off so that a path coupling the power supply terminal 106 and the I/O circuit 130 is blocked. When the clock enable signal CKE is at a low level, the enable signal RefEN is supplied to the power supply terminal 106 via a transfer gate 142. The transfer gate 142 has a configuration in which a P-channel MOS transistor and an N-channel MOS transistor are connected to each other in parallel, where the clock enable signal CKE is supplied to the gate electrode of the P-channel MOS transistor, and a signal CKEf, which is an inversion signal of the clock enable signal CKE, is supplied to the gate electrode of the N-channel MOS transistor. Therefore, the transistor 141 and the transfer gate 142 are exclusively turned on.

The power management IC 200 includes power generators 211, 212, and 213 that generate the power supply voltages VDD1 and VDD2 and a power generator 220 that generates the power supply voltage VDDQ. The power generators 211, 212, and 213 are coupled to one another in parallel, the power supply voltage VDD1 generated by the power generators 211, 212, and 213 is supplied to a power supply output terminal 201, and the power supply voltage VDD2 generated by the power generators 211, 212, and 213 is supplied to a power supply output terminal 202. The power supply output terminal 201 is coupled to a power supply terminal 104 of the DRAM 100 via a power supply line VL1. The power supply output terminal 202 is coupled to a power supply terminal 105 of the DRAM 100 via a power supply line VL2. Meanwhile, the power supply voltage VDDQ generated by the power generator 220 is supplied to a power supply output terminal 203. The power supply output terminal 203 is coupled to the power supply terminal 106 of the DRAM 100 via a power supply line VLQ.

The power generator 211 responds to an enable signal EN supplied firm a controller 300 via an external terminal 205 to be activated. Accordingly, when the enable signal EN is at an inactive level (for example, a low level), the power generator 211 stops a generating operation of the power supply voltages VDD1 and VDD2. The power generator 211 has the highest current supply capability among the power generators 211, 212, and 213. Therefore, the power generator 211 has the largest power consumption among the power generators 211, 212, and 213.

When setting information SET is at a high level, the power generator 212 responds to the enable signal EN or the enable signal RefEN to be activated. Accordingly, in a case where the setting information SET is at a high level, when the enable signal EN and the enable signal RefEN are both at an inactive level (for example, a low level), the power generator 212 stops the generating operation of the power supply voltages VDD1 and VDD2. The power management IC 200 receives the enable signal RefEN from the DRAM 100 via the power supply output terminal 203 coupled to the power supply line VLQ. The power management IC 200 includes an AND gate circuit 241 and an OR gate circuit 242. The enable signal RefEN and an inverted enable signal EN are supplied to the AND gate circuit 241. An output signal of the AND gate circuit 241 and the enable signal EN are supplied to the OR gate circuit 242. Further, the power management IC 200 includes a mode selector 230. The mode selector 230 holds, by using a register or a fuse circuit, the setting information SET for setting whether control on the power generator 212 with the enable signal RefEN is validated. For example, when the control on the power generator 212 with the enable signal RefEN is validated, setting information SET at a high level is held in the mode selector 230, and when the control on the power generator 212 with the enable signal RefEN is invalidated, setting information SET at a low level is held in the mode selector 230. The setting information SET and an output signal of the OR gate circuit 242 are supplied to the AND gate circuit 231. An output signal of the AND gate circuit 231 and the enable signal EN are supplied to the OR gate circuit 232. When an output signal of the OR gate circuit 232 is at a high level, the power generator 212 generates the power supply voltages VDD1 and VDD2, and when the output signal of the OR gate circuit 232 is at a low level, the power generator 212 stops the generating operation of the power supply voltages VDD1 and VDD2.

The current supply capability of the power generator 213 is required-minimum current supply capability for maintaining the level of the power supply voltages VDD1 and VDD2 during a period where the power generators 211 and 212 stop the generating operation of the power supply voltages VDD1 and VDD2.

The power generator 220 responds to the enable signal EN supplied from the controller 300 via the external terminal 205 to be activated. Accordingly, when the enable signal EN is at an inactive level (for example, a low level), the power generator 220 stops a generating operation of the power supply voltage VDDQ. The power supply voltage VDDQ generated by the power generator 220 is supplied to the power supply terminal 106 of the DRAM 100 via the power supply output terminal 203 and the power supply line VLQ. Therefore, during a period where the enable signal EN is at a high level, that is, in a normal operation mode, the power supply voltage VDDQ is properly given to the power supply terminal 106 via the power supply line VLQ. Meanwhile, during a period where the enable signal EN is at a low level, that is, in a standby mode, the output node of the power generator 220 is in a high-impedance state. Accordingly, the power generator 220 enters a state where it is possible to receive the enable signal RefEN from the DRAM 100.

The controller 300 is a semiconductor chip that controls operations of the DRAM 100 and the power management IC 200, and includes external terminals 301 to 304. The external terminal 301 is a terminal that outputs the command address signal CA, and is coupled to the command address terminal 101 of the DRAM 100. The external terminal 302 is a terminal that inputs and outputs data DQ, and is coupled to the data terminal 102 of the DRAM 100. The external terminal 303 is a terminal that outputs the clock enable signal CKE, and is coupled to the CKE terminal 103 of the DRAM 100. The external terminal 304 is a terminal that outputs the enable signal EN, and is coupled to the external terminal 205 of the power generator IC 200.

Figure 2:
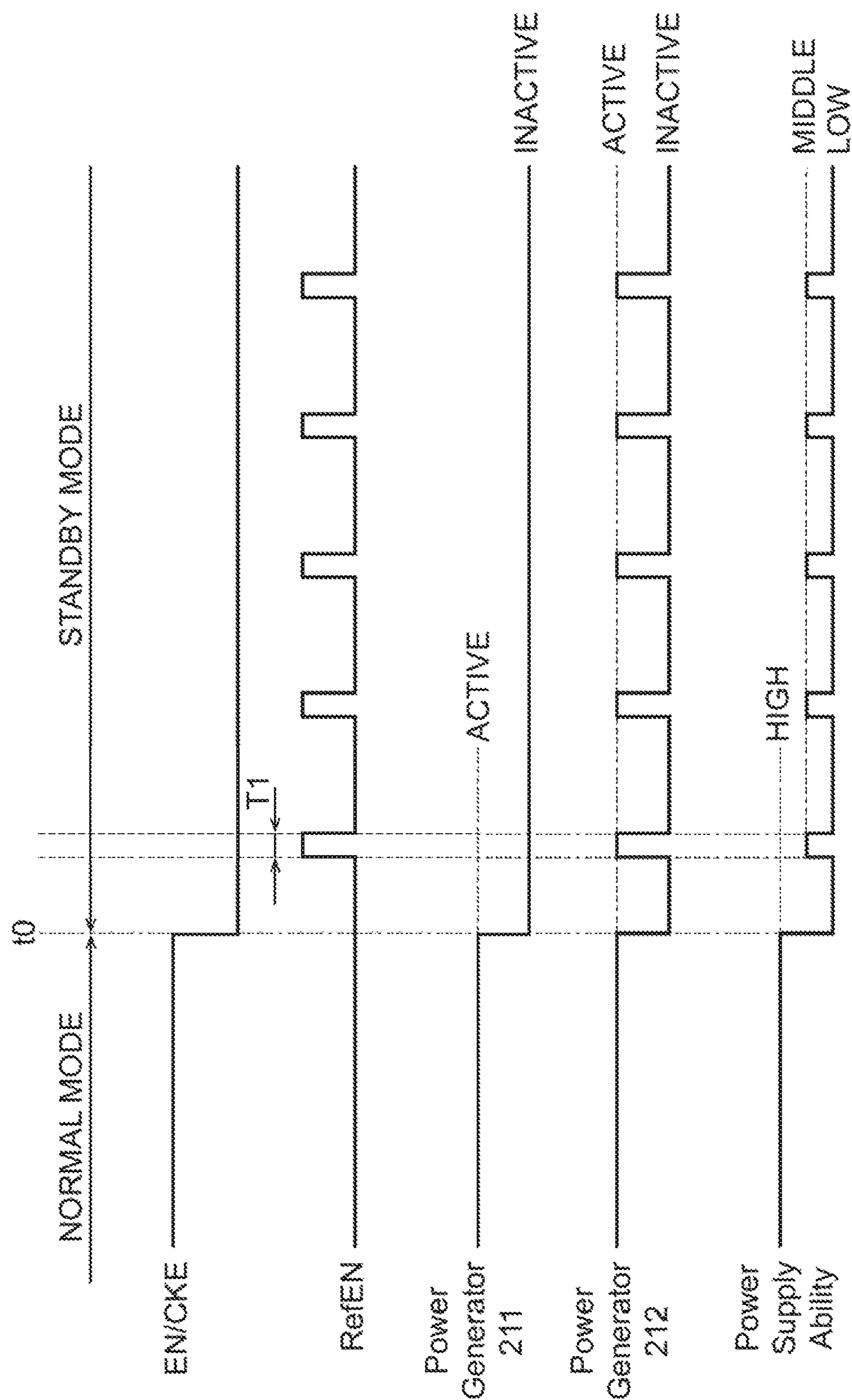
FIG. 2 is a timing chart for explaining an operation of a power management IC.

As shown in FIG. 2, it is permissible that the enable signal EN and the clock enable signal CKE have the same waveform. During a period where the clock enable signal CKE is at a high level, the DRAM 100 is operated in a normal operation mode. In the normal operation mode, because the enable signal EN is activated at a high level, all the power generators 211, 212, and 213 are in an active state. Therefore, the supply capability of the power supply voltages VDD1 and VDD2 of the power management IC 200 becomes a high level, and a sufficient current required for a read operation and a write operation is supplied from the power management IC 200 to the DRAM 100. In the normal operation mode, the power generator 220 is also in an active state, and the power supply voltage VDDQ is supplied to the I/O circuit 130 of the DRAM 100. At this time, the transfer gate 142 is turned off.

At a time t0 shown in FIG. 2, when the clock enable signal CKE is shifted from a high level to a low level, the DRAM 100 is switched from a normal operation mode to a standby mode. In the standby mode, the enable signal EN is inactivated at a low level, the power generator 211 enters an inactive state. Accordingly, the supply capability of the power supply voltages VDD1 and VDD2 of the power management IC 200 is lowered, and thus the power consumption of the power management IC 200 is decreased. In the standby mode, the power generator 220 also enters an inactive state. Further, because the clock enable signal CKE is at a low level, the transistor 141 is turned off, and the transfer gate 142 is turned on. As a result, the power supply line VLQ changes into a path for transferring the enable signal RefEN. The power supply line VLQ is a power supply line for supplying the power supply voltage VDDQ for the I/O circuit 130, and is not used in the standby mode. Therefore, in the present embodiment, the power supply line VLQ is used as a transfer path of the enable signal RefEN.

In the standby mode, in order to hold data in the memory cells MC, the DRAM 100 performs a self-refresh operation. The self-refresh operation is an operation for restoring data in the memory cells MC by activating the word lines WL included in the memory cell array 110 in a predetermined cycle. The self-refresh operation is performed by the access control circuit 120, and during a period where a refresh operation is actually performed, the enable signal RefEN is output from the access control circuit 120. The enable signal RefEN is supplied from the DRAM 100 to the power management IC 200 via the power supply line VLQ. As shown in FIG. 2, a period T1 during which the enable signal RefEN is activated in the standby mode is short and appears periodically.

In the standby mode, during a period where the enable signal RefEN is at a low level, the power generators 211 and 212 are in an inactive state and only the power generator 213 is in an active state, and thus the supply capability of the power supply voltages VDD1 and VDD2 of the power management IC 200 becomes a low level. Accordingly, a current required for operating some circuits such as an oscillator circuit operated in the access control circuit 120 and a required minimum current for compensating a leakage current are supplied from the power management IC 200 to the DRAM 100.

As shown in FIG. 2, when the enable signal RefEN is activated, the power generator 212 temporarily enters an active state, and the supply capability of the power supply voltages VDD1 and VDD2 of the power management IC 200 is increased to a middle level. The middle level is a level of current supply capability between a low level and a high level, and the actual current supply capability is designed based on the current required for a refresh operation.

Due to this configuration, in the standby mode, during a period where the refresh operation is not performed, only the power generator 213 is in an active state, and during a period where the refresh operation is performed, the power generators 212 and 213 are in an active state. In a general memory system, as to when a DRAM is performing a refresh operation in a standby mode cannot be recognized by a power management IC, and thus it is necessary to always set the supply capability of the power supply voltages VDD1 and VDD2 at a middle level. On the other hand, in the present embodiment, the execution timing of the refresh operation in a standby mode is notified to the power management IC 200 from the DRAM 10, and thus the power management IC 200 can set the supply capability of the power supply voltages VDD1 and VDD2 to be a middle level at a timing when the refresh operation is performed, and can set the supply capability of the power supply voltages VDD1 and VDD2 to be a low level during other periods. Accordingly, it is possible to further reduce the power consumption of the power management IC 200 in the standby mode.

Figure 3:
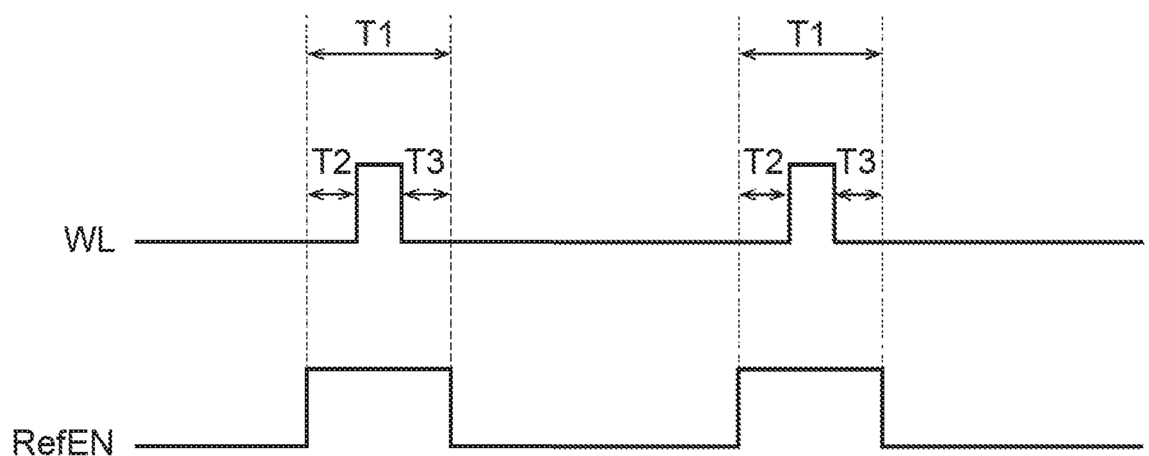
FIG. 3 is a timing chart for explaining a relationship between a refresh period in a DRAM and an enhanced period in the power management IC.

While it is permissible that the period where the enable signal RefEN is activated matches a period where a refresh operation is actually performed, as shown in FIG. 3, it is also permissible that the enable signal RefEN is activated earlier than a timing when the refresh operation is started by a period T2, and that the enable signal RefEN is inactivated later than a timing when the refresh operation is finished by a period T3. Due to this configuration, the supply capability of the power supply voltages VDD1 and VDD2 does not become insufficient during the refresh operation.

In the memory system shown in FIG. 1, because the power supply line VLQ is used for transferring the enable signal RefEN, it is not necessary to add any new external terminal to output the enable signal RefEN to the DRAM 100, and also not necessary to add any new external terminal to input the enable signal RefEN to the power management IC 200.

Figure 4:
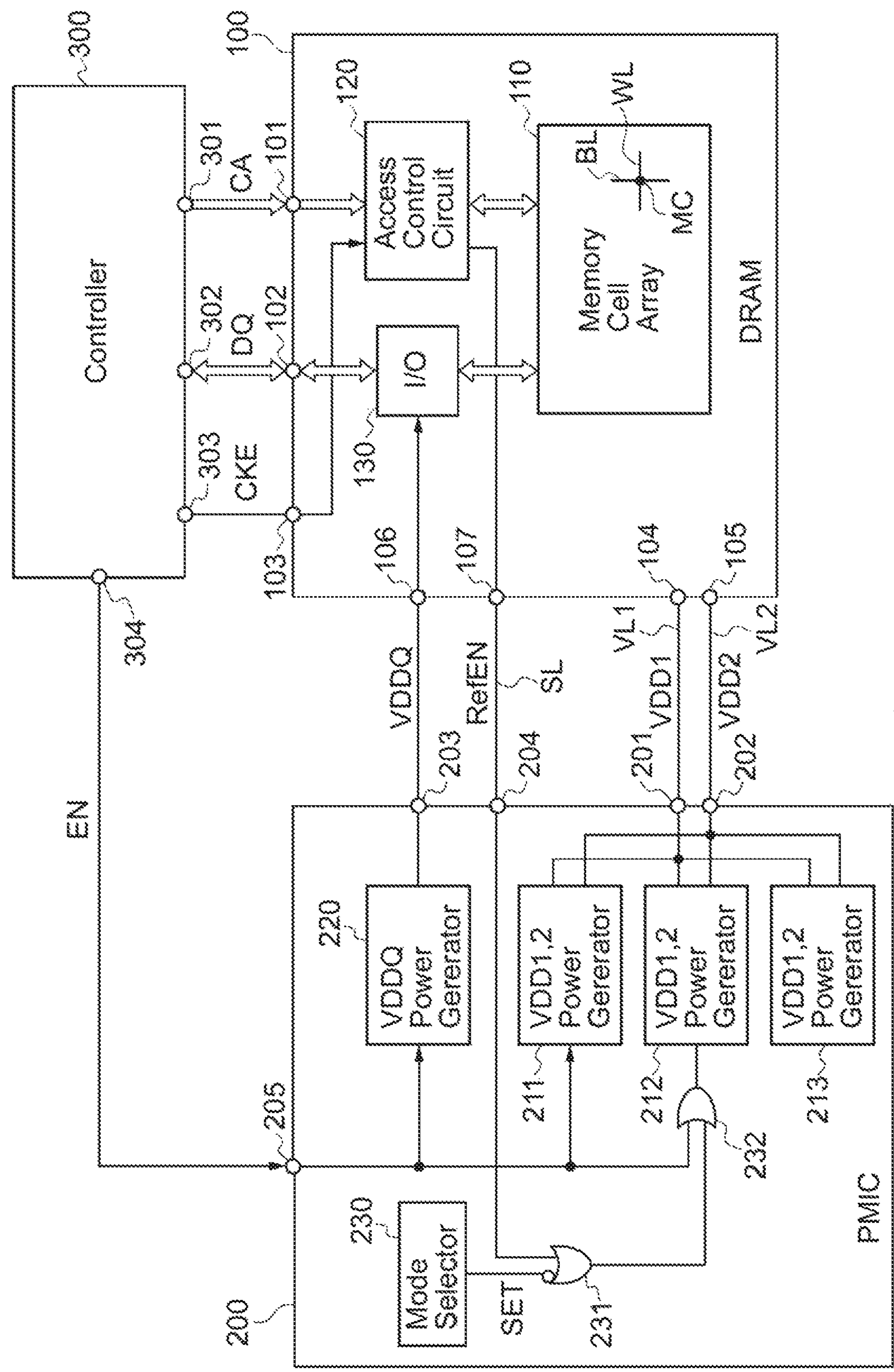
FIG. 4 is a block diagram showing a configuration of a memory system according to a second embodiment.

Further, as in the memory system shown in FIG. 4, it is permissible that a signal line SL for coupling an external terminal 107 of the DRAM 100 and an external terminal 204 of the power management IC 200 is provided to supply the enable signal RefEN to the power management IC 200 from the DRAM 100 via the signal line SL. In this case, it is not necessary to use the transistor 141 or the transfer gate 142. The external terminal 107 of the DRAM 100 can be a dedicated external terminal or can be a part of an external terminal not used in a standby mode, such as any of command address terminals 101, or any of data terminals 102.

Using these embodiments introduced in FIG. 1 to 4, die size and power consumption of the power management IC can be smaller because big capacitors for voltage lines to support stable current are not required in these embodiments. Even in case that the power management IC includes the big capacitors for covering two operation modes controlled by the mode selector, the big capacitors can be electrically disconnected from the voltage lines to inhibit leak currents in the big capacitors so the power consumption can be suppressed.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

The invention claimed is:

1. An apparatus comprising:

a first semiconductor chip including a memory cell array having a volatile memory cell and an access control circuit configured to perform a refresh operation on the volatile memory cell; and a second semiconductor chip including a power generator configured to supply a first power supply voltage to the first semiconductor chip, wherein the access control circuit is configured to activate a first enable signal during the refresh operation, and wherein the second semiconductor chip is configured to change a capability of the power generator based on the first enable signal.

2. The apparatus of claim 1, wherein the power generator includes first and second power generators coupled in parallel, and wherein the second power generator is configured to activate when the first enable signal is activated.

3. The apparatus of claim 2, wherein the first and second power generators are configured to activate when a second enable signal is activated regardless of the first enable signal.

4. The apparatus of claim 3, further comprising a third semiconductor chip configured to generate the second enable signal.

5. The apparatus of claim 4, wherein the first power generator has greater capability than the second power generator.

6. The apparatus of claim 5, wherein the power generator further includes a third power generator coupled in parallel with the first and second power generators, wherein the third power generator is configured to activate regardless of the first and second enable signals, and wherein the second power generator has greater capability than the third power generator.

7. The apparatus of claim 1, wherein the second semiconductor chip further includes a mode selector that invalidates the first enable signal.

8. The apparatus of claim 4, wherein the second semiconductor chip further includes an additional power generator configured to supply a second power supply voltage to the first semiconductor chip via a power supply line, and wherein the first enable signal is transferred from the first semiconductor chip to the second semiconductor chip via the power supply line.

9. The apparatus of claim 8, wherein the additional power generator is configured to stop generating the second power supply voltage when the second enable signal is deactivated.

10. The apparatus of claim 9, wherein the first semiconductor chip further includes an I/O circuit configured to output a data read from the memory cell array to the third semiconductor ship, and wherein the I/O circuit is configured to operate on the second power supply voltage.

11. The apparatus of claim 10, wherein the first semiconductor chip further includes a first switch circuit coupled between the power supply line and the I/O circuit and a second switch circuit coupled between the power supply line and the access control circuit, and wherein the first and second switches are configured to exclusively turn on based on a command signal issued from the third semiconductor chip.

* * * * *